United States Patent
Ueno et al.

(10) Patent No.: US 9,461,206 B2
(45) Date of Patent: Oct. 4, 2016

(54) LIGHT-EMITTING DEVICE, LIGHT-EMITTING DEVICE MODULE, AND VEHICLE LIGHTING UNIT

(75) Inventors: Kazuhiko Ueno, Tokyo (JP); Yasushi Tanida, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 928 days.

(21) Appl. No.: 13/424,365

(22) Filed: Mar. 19, 2012

(65) Prior Publication Data

US 2012/0236584 A1  Sep. 20, 2012

(30) Foreign Application Priority Data

Mar. 17, 2011  (JP) .................................. 2011-059205

(51) Int. Cl.
*F21S 4/00* (2016.01)
*H01L 33/38* (2010.01)
*F21S 8/10* (2006.01)

(52) U.S. Cl.
CPC ............ *H01L 33/38* (2013.01); *F21S 48/1154* (2013.01); *H01L 2224/13* (2013.01)

(58) Field of Classification Search
USPC .............. 362/227, 249.01, 249.02, 253, 487, 362/538, 540, 543, 545, 800; 257/88, 91, 257/99
See application file for complete search history.

(56) References Cited

U.S. PATENT DOCUMENTS

| | | | |
|---|---|---|---|
| 2001/0032985 | A1 | 10/2001 | Bhat et al. |
| 2009/0020769 | A1 | 1/2009 | Yoneda et al. |
| 2010/0309681 | A1 | 12/2010 | Ohno |

FOREIGN PATENT DOCUMENTS

| | | |
|---|---|---|
| JP | 2003-243709 A | 8/2003 |
| JP | 2007-258276 A | 10/2007 |
| JP | 2007-300134 A | 11/2007 |
| KR | 1020080005726 A | 1/2008 |

OTHER PUBLICATIONS

Chinese Office Action for the related Chinese Patent Application No. 201210144259.4 dated Oct. 10, 2015.
EP2 500 627 publication with European Search Report dated Dec. 1, 2015.

*Primary Examiner* — Andrew Coughlin
*Assistant Examiner* — Meghan Ulanday
(74) *Attorney, Agent, or Firm* — Kenealy Vaidya LLP

(57) ABSTRACT

A light-emitting device module can include a plurality of light-emitting devices arranged in line so as to form a luminance distribution for preventing horizontal stripes from being generated in a light distribution pattern. The light-emitting device can include a rectangular light-transmitting substrate, an underlayer semiconductor layer formed on the rectangular light-transmitting substrate, a plurality of first electrodes formed on the underlayer semiconductor layer in an island shape, a light-emitting semiconductor layer including a light-emitting layer formed on the underlayer semiconductor layer, the light-emitting semiconductor layer configured to surround and separate the respective first electrodes, and a second electrode formed on the light-emitting semiconductor layer. The first electrodes can be arranged to form a plurality of electrode rows parallel with one side of the rectangular light-transmitting substrate.

10 Claims, 14 Drawing Sheets

Fig. 15
| | LED module | Inverted projection image I |
|---|---|---|
| Ex1 | 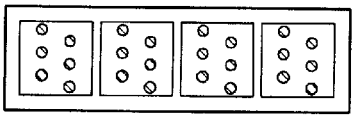 | 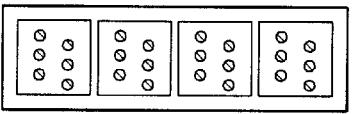 |
| Ex2 | 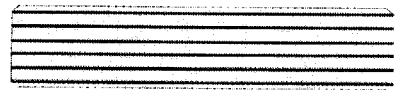 | 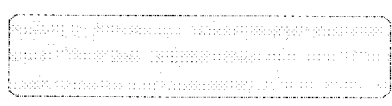 |
| Ex3 | 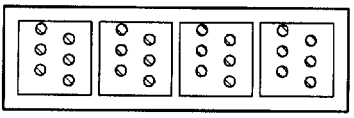 | 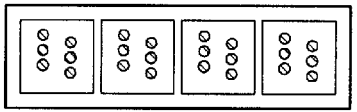 |
| Ex4 | 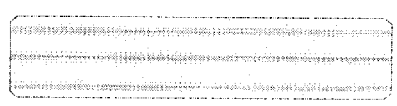 | 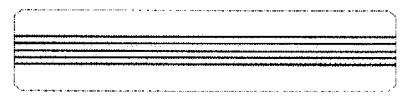 |

LIGHT-EMITTING DEVICE, LIGHT-EMITTING DEVICE MODULE, AND VEHICLE LIGHTING UNIT

This application claims the priority benefit under 35 U.S.C. §119 of Japanese Patent Application No. 2011-059205 filed on Mar. 17, 2011, which is hereby incorporated in its entirety by reference.

TECHNICAL FIELD

The presently disclosed subject matter relates to a light-emitting device, and in particular, to a flip-chip type light-emitting device for use in a vehicle lighting unit, a light-emitting module, and a vehicle lighting unit.

BACKGROUND ART

Conventional light-emitting devices (such as an LED device) in which semiconductor crystals such as III family nitride compound semiconductors are grown on a light-transmitting growth substrate such as a sapphire have been known. When such an LED device is to be mounted on a circuit pattern, the light-transmitting growth substrate can be used to produce a flip-chip type LED device in which light can be extracted from the growth substrate side.

Japanese Patent Application Laid-Open No. 2003-243709 describes an LED device. Such an LED device is shown in FIGS. 1 and 2. A first contact layer is deposited on a sapphire substrate, and 9 (nine) circular n electrodes are formed to be arranged in a rectangular matrix manner. Further, a rectangular light-emitting portion is formed in a manner such that a light-emitting semiconductor layer surrounds the respective circular n electrodes. In the LED device, the light-emitting semiconductor layer including a light-emitting layer interposed between cladding layers, a second contact layer and a p electrode are stacked on the first contact layer in this order. This LED device can be flip-chip mounted via bumps (not shown) to be electrically connected at the side where the p electrode and the n electrodes are exposed, and when a current is supplied so that the device emits light, heat generated from inside of the light-emitting semiconductor layer during the light emission can be effectively dissipated through the bumps. In this LED device, the light from the light-emitting layer corresponding to the p electrode can be emitted through the sapphire substrate so as to surround the n electrodes. (See the arrows in FIG. 2.)

Examples of such a flip-chip type LED device may include: one having comb-shaped cathode and anode electrodes disposed in an alternate manner to cause a rectangular light-emitting surface to emit light entirely (see, for example, Japanese Patent Application Laid-Open No. 2007-258276); and one having a comb-shaped p electrode with wide tooth portions and thin n electrodes each disposed in between the adjacent wide tooth portions of the p electrode to cause a rectangular light-emitting surface to emit light entirely (see, for example, Japanese Patent Application Laid-Open No. 2007-300134), and the like.

LED devices have been developed to be utilized as a light source in the form of an LED module for a vehicle lighting unit. In particular, a common vehicle LED module may have a directivity in a Lambertian distribution, and accordingly, an LED module having a rectangular light-emitting surface formed by arranging a plurality of rectangular LED devices in line in the same direction can be typically utilized in a vehicle headlamp. When a vehicle headlamp utilizes a headlamp optical system using a convex lens and a reflector in combination, such an LED module with a rectangular light-emitting surface can be used to be disposed at or near the rear-side focal point of the optical system.

A vehicle headlamp is required to have high luminance, and an LED module for use in a headlamp is required to include an LED device capable of receiving a large amount of current and have a high light utilization efficiency. In view of this, a flip-chip type LED device can provide benefits when utilized as an LED module for a vehicle headlamp since a large amount of current can be supplied via a plurality of bumps, no wiring, which otherwise hinders the light emission, is required, and the distance between the adjacent devices can be shortened.

Further, in the technical field of a vehicle headlamp to be disposed on both right and left sides of a vehicle front body, a passing light distribution pattern or a low beam light distribution pattern should be formed so that any glare light to a driver in an opposite vehicle cannot be generated by the headlamp during the vehicle passing each other. This light distribution pattern can be formed of a horizontally wide luminance distribution in order to ensure the front visibility for a driver who is driving the vehicle. Such a low beam light distribution pattern (hereinafter, simply referred to as a "light distribution pattern") should have a cut-off line including an opposite-lane-side cut-off line and an own-lane-side cut-off line that extends at an upper level or in an obliquely upward direction from an elbow point (changing point) with respect to the opposite-lane-side cut-off line. Accordingly, the vehicle headlamp can be configured to provide an appropriate luminance distribution near and below the cut-off line, so that the wider area of the road in front of the vehicle body can be illuminated with the light from the vehicle headlamp.

When such a vehicle headlamp with the above-mentioned light distribution pattern includes an LED module, the LED module is required to provide more uniform luminance distribution as well as higher luminance. In order to satisfy the requirements, such an LED module may be designed to include a plurality of the above flip-chip type LED devices at a higher density. However, in this case, light-emission unevenness between the respective LED devices, leading to lower the production yield. It would be possible to expand the surface area of each LED device. However, since the flip-chip type LED device can emit light from the light-emitting layer corresponding to the p electrode through the sapphire substrate while the light is emitted so as to surround the n electrodes (cathode electrodes), the unevenness of the luminance distribution of each LED device may be problematic. Namely, there is the problem of the luminance distribution unevenness due to the difference in luminance between the areas where the n electrodes are arranged without the light-emitting semiconductor layer and the remaining area.

Further, the illuminance unevenness in a light distribution pattern for a headlamp is affected less by horizontal stripes than by longitudinal stripes generated by its optical system. This is because the illuminance unevenness in longitudinal stripes generated in an LED module can be alleviated more by the optical system than that in horizontal stripes, resulting in smaller illuminance unevenness in the light distribution pattern. Therefore, it is beneficial to suppress the generation of horizontal stripes in the luminance distribution in an LED module.

SUMMARY

The presently disclosed subject matter was devised in view of these and other problems and features and in association with the conventional art. According to an aspect of the presently disclosed subject matter, a light-emitting device module having a superior evenness in a light distribution suitable for a light source for a vehicle headlamp and the like can be provided. In particular, a light-emitting device module can include a plurality of light-emitting devices arranged in line so as to form a luminance distribution for preventing horizontal stripes from being generated in a light distribution pattern. Further provided is a vehicle lighting unit utilizing the same.

According to another aspect of the presently disclosed subject matter, a flip-chip type light-emitting device can include a rectangular light-transmitting substrate, and a first electrode and a second electrode opposed to the light-transmitting substrate. The flip-chip type light-emitting device can be mounted such that opposed two sides of the rectangular light-transmitting substrate are directed in a horizontal direction. Specifically, the flip-chip type light-emitting device can include the rectangular light-transmitting substrate, an underlayer semiconductor layer formed on the rectangular light-transmitting substrate, a plurality of the first electrodes formed on the underlayer semiconductor layer in an island shape, a light-emitting semiconductor layer including a light-emitting layer formed on the underlayer semiconductor layer, the light-emitting semiconductor layer configured to surround and separate the respective first electrodes, and a second electrode formed on the light-emitting semiconductor layer. In the flip-chip type light-emitting device with the above configuration, the first electrodes can be arranged to form a plurality of electrode rows parallel with one side of the rectangular light-transmitting substrate. When, among horizontal lines perpendicular to a direction in which the electrode rows are arranged and parallel with the opposed two sides of the rectangular light-transmitting substrate, two horizontal lines each crossing any of the first electrodes within a maximum electrode width of the first electrode and closest to the two sides can be defined as two reference horizontal lines, and the first electrodes in the two adjacent electrode rows can be arranged on any horizontal lines between the two reference horizontal lines. Furthermore, the two adjacent electrode rows can be formed such that the total of the electrode widths of the first electrodes on any of the horizontal lines between the two reference horizontal lines can be 35% or more and 65% or less of the total of the maximum electrode widths of the two first electrodes crossing the two reference horizontal lines.

When the above flip-chip type light-emitting devices are arranged in line so as to match one side of the rectangular light-transmitting substrate to the line and are formed into a light-emitting device module having a longitudinal direction as the extending direction along the line, the produced light-emitting device module can have an improved evenness of luminance distribution on the desired light extracting surface and an enhanced light emission efficiency when compared with the case where the total of the electrode widths of the first electrodes on the horizontal lines between the two reference horizontal lines falls outside the range of 35% or more and 65% or less of the total of the maximum electrode widths of the two reference horizontal lines. Further, the presently disclosed subject matter can improve the evenness of luminance distribution on the desired light extracting surface and enhance the light emission efficiency.

According to still another aspect of the presently disclosed subject matter, a light-emitting device module can include a plurality of the above flip-chip type light-emitting devices one sides of which are aligned on one line, the one sides being perpendicular to the electrode rows of the rectangular light-transmitting substrate can be arranged such that the one sides match to the one line.

According to still another aspect of the presently disclosed subject matter, a vehicle lighting unit made in accordance with the presently disclosed subject matter can have an optical axis and include the above light-emitting device module, a base portion to which the light-emitting device module is secured so as to allow the longitudinal direction of the light-emitting device module to be horizontal when viewed from front while the light-emitting device module faces frontward, and a projection lens disposed on the optical axis extending forward from the light-emitting device module on the base portion, for projecting light emitted from the light-emitting device module forward. The vehicle lighting unit can include the above light-emitting device module and a projection optical system for projecting a light source image of the light-emitting device module forward so as to form a light distribution pattern for a headlamp including a cut-off line on a virtual vertical screen assumed to be disposed in front of a vehicle body. The projection optical system can be configured such that the image portions corresponding to the electrode rows are arranged perpendicular to the horizontal line of the cut-off line in the light distribution pattern.

When the above flip-chip type light-emitting devices are arranged in line so as to match one side of the rectangular light-transmitting substrate to the line and are formed into a light-emitting device module having a longitudinal direction as the extending direction along the line, the vehicle lighting unit utilizing the produced light-emitting device module can have an improved evenness of luminance distribution in the light distribution pattern and an enhanced light emission efficiency when compared with the case where the total of the electrode widths of the first electrodes on the horizontal lines between the two reference horizontal lines falls outside the range of 35% or more and 65% or less of the total of the maximum electrode widths of the two reference horizontal lines.

The above type of a flip-chip type light-emitting device can be differently defined as follows, A flip-chip type light-emitting device can include: a rectangular light-transmitting substrate defined by a first side and a second side opposed to each other and a third side and a fourth side both perpendicular to the first side; a first electrode and a second electrode both formed on a same surface of the rectangular light-transmitting substrate; an underlayer semiconductor layer formed on the rectangular light-transmitting substrate; a plurality of the first electrodes formed on the underlayer semiconductor layer in an island shape; a light-emitting semiconductor layer including a light-emitting layer formed on the underlayer semiconductor layer, the light-emitting semiconductor layer configured to surround and separate the respective first electrode; and a second electrode formed on the light-emitting semiconductor layer. In this configuration, the first electrodes can be arranged to form a plurality of electrode rows including at least a first electrode row and a second electrode row parallel with the first side of the rectangular light-transmitting substrate. When, among parallel lines crossing the first electrode in the first electrode row closest to the third side of the rectangular light-transmitting substrate and parallel with the third side, a parallel line crossing the first electrode in the first electrode row with a maximum electrode width can be referred to as a third side reference line. When, among parallel lines crossing the first electrode in the second electrode row closest to the fourth side of the rectangular light-transmitting substrate and parallel with the fourth side, a parallel line crossing the first electrode in the second electrode row with a maximum electrode width can be referred to as a fourth side reference line. In this case, the first electrodes can be arranged such that any parallel lines parallel with the third side between the third side reference line and the fourth side reference line cross any of the first electrodes, and the total of an electrode width of the first electrode in the first electrode row and an electrode width of the first electrode in the second electrode row crossing the parallel line parallel with the third side can be 35% or more and 65% or less of the total of the maximum electrode widths of the first electrodes crossing the two reference lines.

Accordingly, in a light-emitting device module for a vehicle in which it is difficult to even the luminance distribution by overlapping luminous fluxes emitted from the plurality of light-emitting devices arranged in line, light with improved evenness of luminance distribution can be irradiated. Furthermore, there are provided vehicle lighting units capable of forming desired cut-off lines with even luminance distribution with the use of the light-emitting device module with the above configuration.

BRIEF DESCRIPTION OF DRAWINGS

These and other characteristics, features, and advantages of the presently disclosed subject matter will become clear from the following description with reference to the accompanying drawings, wherein:

FIG. 15 is a diagram including the front views of the light-emitting device modules and the observed results of reversed projection images I of the light-emitting device modules, illustrating the test examples;

DESCRIPTION OF EXEMPLARY EMBODIMENTS

A description will now be made below to light-emitting devices, light-emitting device modules, and vehicle lighting units of the presently disclosed subject matter with reference to the accompanying drawings in accordance with exemplary embodiments.

Herein, the directions including upper, lower, front, rear, right and left directions may be defined on the basis of the corresponding directions of a vehicle body while assuming that the vehicle lighting unit is installed on the vehicle body.

Types of a vehicle headlamp can be broadly divided into, for example, a projector type headlamp having a projector type optical system including a light-emitting device module (hereinafter, sometimes simply referred to as an "LED module"), a convex lens, and a reflector used in combination; a reflector type headlamp having a reflector type optical system including an LED module for a vehicle and a reflector in combination without a convex lens; and a direct projection type headlamp having a direct-projection type optical system including an LED module for a vehicle and a convex lens in combination without a reflector. Examples of the reflector may include a continuous reflector of a revolved parabola having a focal point at or near an LED module, and a so-called multi-reflector having a plurality of small reflection areas obtained by segmenting a revolved parabola. In the projector type headlamp and the reflector type headlamp which utilize reflectors in combination for forming desired light distribution patterns, the projection image of the LED module as a light source may be rotated about an optical axis of the module to be partly projected obliquely. Due to this, the light distribution patterns may not include horizontal stripes with dark and bright areas.

A description will be given of an exemplary embodiment of a direct projection type headlamp having a direct projection type optical system without the rotation of the projection image of an LED module by a reflector. The presently disclosed subject matter is not limited to this particular headlamp but may be applied to various headlamps having various optical systems.

[Direct Projection Type Headlamp]

Figure 3:
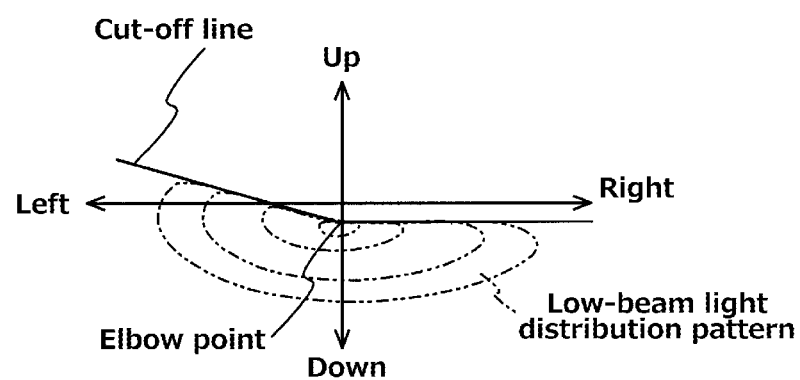
FIG. 3 is a schematic diagram illustrating a passing light distribution pattern of a vehicle headlamp.

In general, the light distribution pattern for a vehicle is configured such that, as shown in FIG. 3, light is gathered in the vertical direction while diffused in the horizontal direction. The diffusion angle may range between about 10 degrees and about 15 degrees in the vertical direction and from about ±30 degrees to about ±60 degrees in the horizontal direction. Accordingly, the diffusion angle in the horizontal direction may be 4 to 12 times the diffusion angle in the vertical direction.

The light distribution pattern should include a bright/dark border near the horizontal line (cut-off line). The light should be converged at or near the cut-off line to be projected farther with a large amount of light, thereby illuminating a wider area with high illumination.

Figure 4:
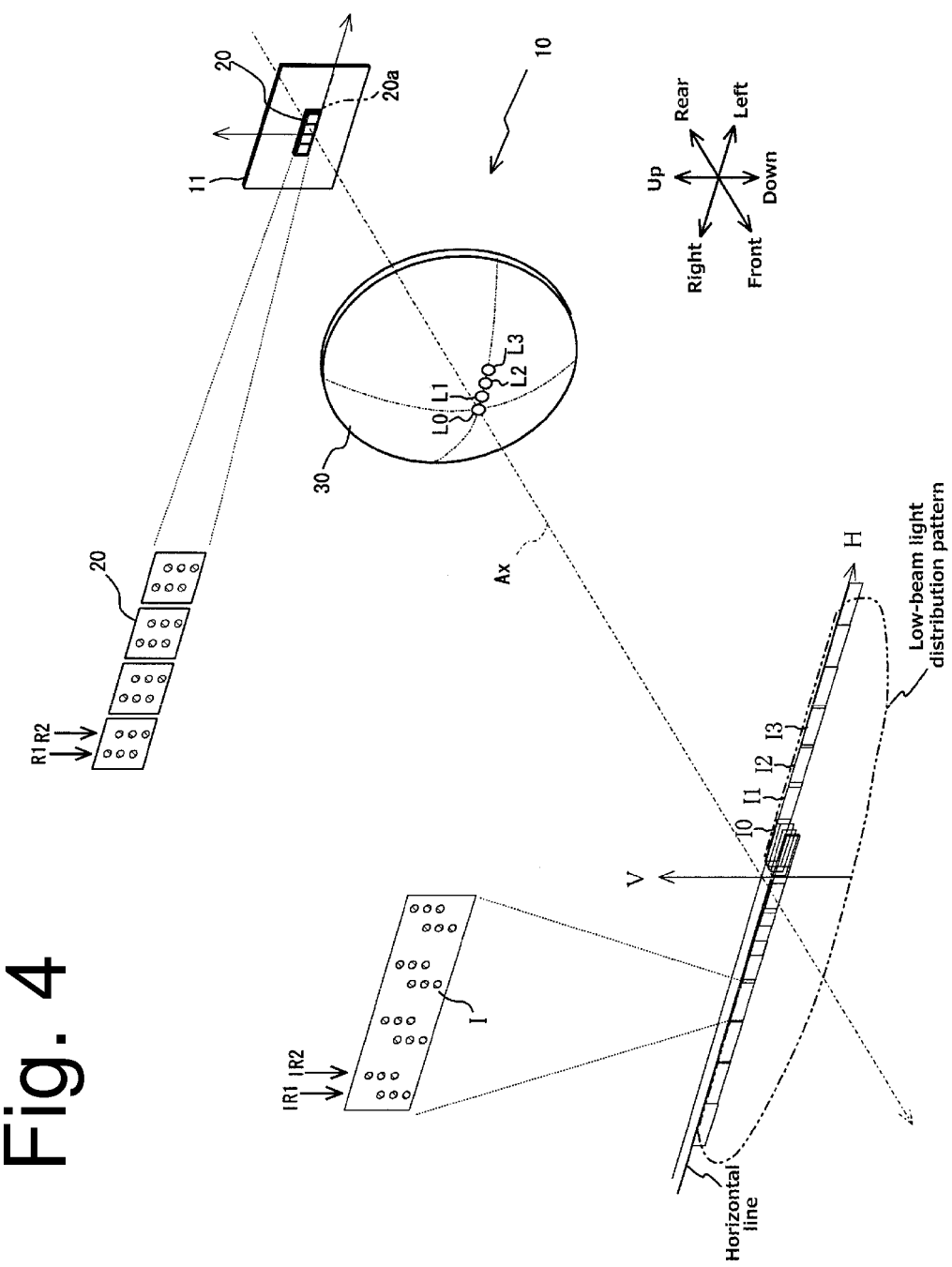
FIG. 4 is a schematic perspective view illustrating a vehicle headlamp of an exemplary embodiment made in accordance with principles of the presently disclosed subject matter and including a direct projection type optical system, with an exemplary light distribution pattern.

In order to achieve the formation of a desired light distribution pattern by such a headlamp, the direct projection type headlamp as shown in FIG. 4 can include a projector optical system 10 with a projector lens 30. The projector lens 30 may be a planar one for refracting light in order to converge the light at or near the cut-off line in the vertical direction while diffusing the light in the horizontal direction by varying the diffusion angles in the vertical and horizontal directions.

The projector lens can be configured to have partially varied diffusion angles in an inclined direction at 15 degrees or 45 degrees, for example, in order to form a cut-off line inclined at 15 degrees or 45 degrees. This configuration can achieve the illumination of pedestrian side in accordance with the same principle.

Because of the same reason, the light emission shape of the LED light source (light source utilizing an LED module) to be projected is desirably wide in the horizontal direction and narrow in the vertical direction. Ratios of the dimension in the vertical direction to the dimension in the horizontal direction can be between 1:2 and 1:6. This light source may be suitable for light control while suppressing the flatness of the projector lens.

Figure 5:
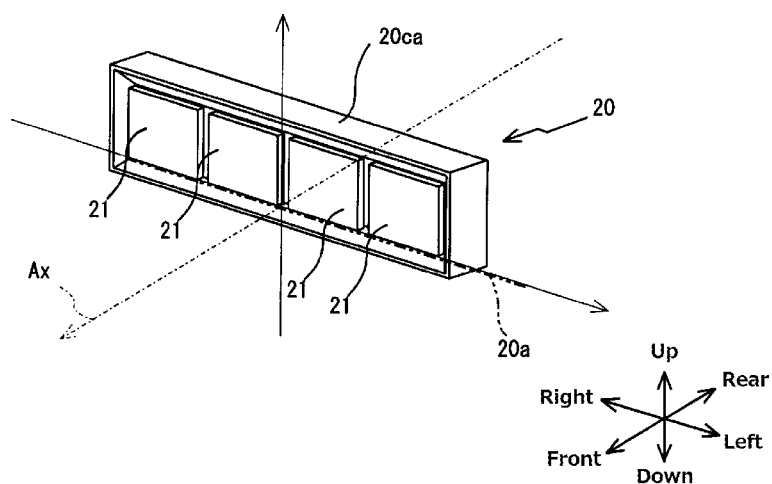
FIG. 5 is a schematic perspective view illustrating parts of a light-emitting device module for the vehicle headlamp including the direct projection type optical system.

FIG. 4 includes a projection image of the LED light source or LED module 20 projected on a virtual vertical plane by the projector lens 30. Note that the virtual vertical plane can be assumed to be perpendicular to the optical axis Ax and a plane including V-H lines in front of the vehicle body at a predetermined distance. FIG. 5 is a schematic perspective view of the LED module 20 included in the projector optical system 10. As shown in FIG. 5, the LED module 20 can include four rectangular LED devices 21 each having a rectangular light emission surface and arranged in line, and a rectangular casing 20ca formed of a ceramic to contain the four LED devices 21. As shown in FIGS. 4 and 5, the projector optical system 10 can include a support base portion 11, and the LED module 20 can be adhered to the front surface of the support base portion 11 with fixing means such as an adhesive or other fixing member (not shown). In this case, the LED module 20 can be secured to be horizontally long when viewed from its front side. Heat dissipation means such as a heat dissipation fin (not shown) can be provided on the rear surface of the support base portion 11.

As shown in FIGS. 4 and 5, the lower end 20a of the rectangular light emission surface of the LED light source 20 can substantially coincide with the optical axis Ax of the projector lens 30, thereby projecting and reversing the image of the lower end of the rectangular light emission surface by the projector lens 30 toward or near the cut-off line.

In FIG. 4, the projected images of the LED light source can be formed by allowing the images to pass through the projector lens at one position and be projected on the virtual vertical plane. Specifically, the projected image formed by allowing light to pass the point L0 of the projector lens 30 can be an image I0, the projected image formed by allowing light to pass the point L1 of the projector lens 30 can be an image I1, the projected image formed by allowing light to pass the point L2 of the projector lens 30 can be an image I2, and the like.

Accordingly, the light distribution pattern formed by this headlamp can be composed of a plurality of projected images of the light source by refracting light at various points of the projector lens and overlapping the refracted beams of light appropriately.

When the diffusion angle of the projector lens is small in the vertical direction, it means many projected light source images are overlapped with one another in the vertical direction. In actual, many light source images are overlaid at or near the cut-off line.

When the diffusion angle of the projector lens is large in the horizontal direction, it means many projected light source images are distributed in a horizontally wider area and not overlapped with one another.

Accordingly, the unevenness of the illuminance distribution may significantly appear at that portion where many light source images are overlapped with one another or the light source images are just overlapped with each other.

Note that the projector optical system 10 may include a shading member for partially shielding the light from the light source in order to form a clear cut-off line (cut-off pattern) (not shown).

[LED Module]

Figure 6:
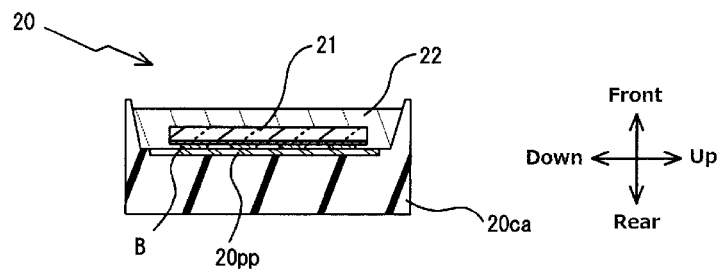
FIG. 6 is a schematic cross-sectional view illustrating the light-emitting device module of an exemplary embodiment made in accordance with the principles of the presently disclosed subject matter.

As shown in FIG. 6, the rectangular casing 20ca for the LED module 20 can have a wiring pattern 20pp at the bottom of the front concave portion thereof. P electrodes and n electrodes of the LED devices 21 can be electrically connected onto the wiring pattern 20pp via bumps B. The LED module 20 can include a wavelength conversion layer 22 disposed to cover the light emission surfaces of the LED devices 21. The wavelength conversion layer 22 can be a phosphor layer. The wavelength conversion layer 22 can be configured to be excited by part of light from the LED devices 21 and emit light with its wavelength having been converted, whereby the wavelength converted light and the original light can be mixed to be projected forward.

For example, in the LED module 20, the LED devices 21 can emit blue light and the wavelength conversion layer 22 can receive part of the blue light to be excited thereby to emit yellow light. The yellow light wavelength converted by the wavelength conversion layer 22 and the blue light can be mixed to generate white light (pseudo white light). The wavelength conversion layer 22 can be formed from a layer containing a phosphor excited by blue light and emitting yellow light, for example, a resin layer in which phosphor particles such as YAG phosphor particles are dispersed.

[LED Device]

Figure 7:
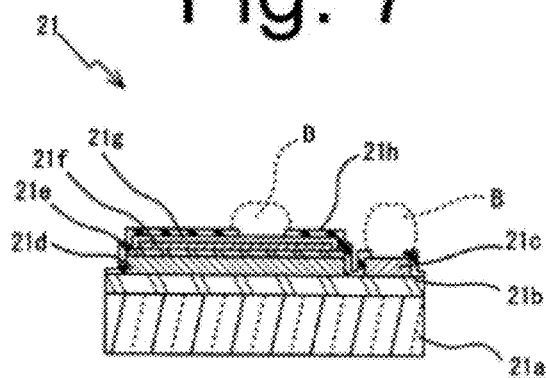
FIG. 7 is a schematic cross-sectional view illustrating a flip-chip type light-emitting device of the exemplary embodiment made in accordance with the principles of the presently disclosed subject matter.

As shown in FIG. 7, the LED device 21 can include a rectangular substrate 21a, an n-type semiconductor layer 21b formed on one surface of the substrate 21a, n electrodes 21c formed on the surface of the n-type semiconductor layer 21b in an island shape, an active layer 21d formed on the surface of the n-type semiconductor layer 21b so as to surround the n electrodes 21c, a p-type semiconductor layer 21e formed on the surface of the active layer 21d, a transparent electrode 21f formed on the surface of the p-type semiconductor layer 21e, and a p electrode 21g formed from a reflective metal on the surface of the transparent electrode 21f. The LED device 21 can further include a protective film 21h that can cover and protect all the components formed on the one surface of the substrate 21a, except that the protective film 21h can have openings for exposing the n-type semiconductor layer 21b and the p electrode 21g to be bonded to bumps B.

The substrate 21a can be a single crystalline substrate such as a sapphire substrate to be transparent to blue light. The n-type semiconductor layer 21b can be a nitride semiconductor layer such as an n-GaN layer. The active layer 21d can be a light-emitting layer such as an InGaN layer. The p-type semiconductor layer 21e can be a nitride semiconductor layer such as a p-GaN layer. The transparent electrode 21f can be a low resistance transparent electrode of thin film formed from, such as, AuNi or ITO. The transparent electrode 21f can be provided to compensate for current diffusion of the p-type semiconductor layer 21e having higher resistivity than the n-type semiconductor layer 21b. The p electrode 21g can be an electrode having a high reflectance with respect to blue light. The p electrode 21g can be formed almost entire area so as to surround and separate the respective n electrodes 21c formed in an island shape. The n electrodes 21c will be described in detail. The LED device 21 of the present exemplary embodiment can output more than a face-up type LED device because of the reflection action of the p electrode 21g. Furthermore, since the LED device 21 of the present exemplary embodiment can have the p electrode 21g with a higher heat dissipation effect that is larger than the n electrode, the adverse effect due to the heat generated by the LED device 21 with large current supplied can be prevented or alleviated (the deterioration of the luminance can be prevented).

Next, a method of producing the LED device 21 will be described.

First, the sapphire substrate 21a is prepared. Then, semiconductor layers including the n-type semiconductor layer 21b, the active layer 21d, the p-type semiconductor layer 21e and the like are epitaxially grown on the substrate 21a by MOCVD.

During the growth of the semiconductor layers, the sapphire substrate 21a is transferred into an MOCVD apparatus and thermally cleaned under the hydrogen atmosphere at 1000° C. for 10 minutes. Then, TMG (trimethylgallium) and NH$_3$ are supplied thereto to form a buffer layer (not shown) formed from a GaN layer.

Consequently, TMG, NH$_3$, and SiH$_4$ as a dopant gas are supplied to form the n-type semiconductor layer 21b formed from an n-type GaN layer. Then, the active layer 21d is formed on the n-type semiconductor layer 21b. In the present exemplary embodiment, a multi-quantum well structure formed from InGaN/GaN was used as the active layer 21d. Namely, InGaN/GaN is grown as one cycle and five cycles are performed. More specifically, TMG, TMI (trimethylindium), and NH$_3$ are supplied to form an InGaN well layer, and subsequently, TMG and NH$_3$ are supplied to form a GaN barrier layer. This process is repeated five times to form the active layer 21d. Next, TMG, TMA (trimethylaluminum), NH$_3$ and Cp$_2$Mg (bis-cyclopentadienyl Mg) serving as a dopant are supplied to form a p-type AlGaN cladding layer (not shown). Subsequently, TMG, NH$_3$, and Cp$_2$Mg are supplied to form a p-type semiconductor layer 21e formed of a p-type GaN layer.

Then, dry etching is performed from above the wafer to expose part of the n-type semiconductor layer 21b (n-type GaN layer). A resist pattern for covering the exposed portion of the n-type semiconductor layer 21b (n-type GaN layer) is formed by photolithography, and a transparent electrode 21f formed of ITO is formed to cover the p-type semiconductor layer 21e. Subsequently, the electron beam deposition method is performed to form a p electrode 21g. In this case, the p electrode 21g can be a multi-layered film formed of Ag/Ti/Pt/Au, for example. The p electrode 21g can be formed by a resistance heating deposition method. After that, the resist pattern is removed by a remover.

Next, Ti and Al are sequentially deposited on the exposed surface of the n-type semiconductor layer 21b (n-type GaN layer), and further, Ti/Au is deposited thereon in order to improve the bonding property, thereby forming an n electrodes 21c. When forming the n electrodes 21c, the area other than the areas where to form the electrodes should be covered with a mask formed in advance by photolithography and the like. After the formation of the n electrodes 21c, the mask is removed by a remover.

Figure 8:
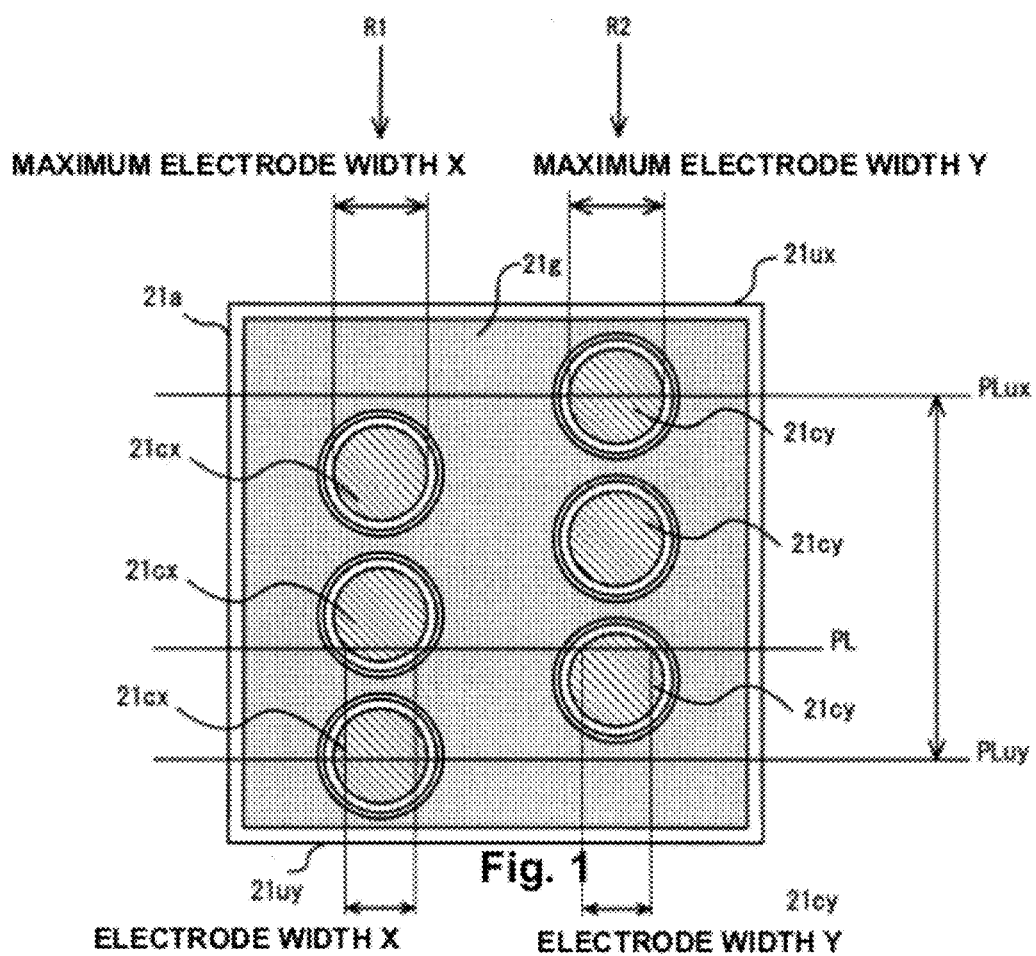
FIG. 8 is a schematic plan view illustrating the flip-chip type light-emitting device when viewed from a rear side of the light emission surface.

The p electrode 21g is formed over the entire p-type semiconductor layer 21e such that the p electrode 21g surrounds the six circular island-shaped n electrodes 21cx and 21cy while separating them, as shown in FIG. 8. Note that the island-shaped n electrodes 21cx and 21cy can take any curved shape other than a circular shape, such as an elliptic shape, but can take a shape including a curved line which is provided at the portion facing to an adjacent electrode and is projected to the adjacent electrode along the direction perpendicular to the horizontal line.

Next, a mask is formed by photolithography at an area other than areas where to form openings for bumps for respective electrodes, and a protective film 21h made of SiO$_2$ or SiN covers all the components formed on one surface of the substrate 21a for protection.

In this manner, the LED device 21 can be produced. Note that the above-described LED device 21 is a device formed on a sapphire substrate, but this is not limitation. A flip-chip LED device can be supported on a silicon carbide substrate. Further, in the above exemplary embodiment, when the first electrode is an n electrode and the second electrode is a p electrode, the active layer for light emission is configured to be disposed near the p electrode (second electrode). However, the presently disclosed subject matter can be applied to a flip-chip LED device where the first electrode is a p electrode, the second electrode is an n electrode, and the active layer for light emission is disposed near the n electrode (second electrode). This means that the electrode having a wider area and disposed near the light emission active layer serves as the second electrode with high reflection property while a plurality of island-shaped electrodes serve as the first electrode.

Hereinafter, a description will be made to a method for producing an LED module according to one exemplary embodiment.

First, a ceramic rectangular case is prepared. The case can have a front concave portion with a bottom on which a wiring pattern 20$pp$ is provided. The wring pattern 20$pp$ include electrode pads formed thereon corresponding to bumps. Then, bumps are supplied onto the electrode pads. Four LED devices 21 produced by the above-described method with uniform characteristics are arranged in line at regular intervals within the case so that one sides of the rectangular transparent substrates of the respective LED devices 21 are aligned along one straight line 21$a$ (see the lower end line 20$a$ of FIG. 5). In this case, the LED devices 21 should be installed so that the openings for bumps of the LED device 21 face to the pumps. As shown in FIG. 6, the LED devices 21 are mounted to the mounting portion of the wiring pattern 20$pp$ via a bonding material (bump B), for example, by bump bonding with the application of ultrasonic waves and load.

Next, the wavelength conversion layer 22 is formed. For example, a material mixture liquid containing a silicone resin material and a YAG phosphor particle dispersed therein is dropped by a dispenser. The coating film can be formed as a single rectangular film covering the four LED devices 21 simultaneously. The surface of the coating film should be leveled for removing its unevenness. This configuration is beneficial because the single coating film can have a constant phosphor concentration over the respective LED devices 21. Then, the coating film can be cured while the shape thereof is maintained, to form the wavelength conversion layer 22.

In this manner, the LED module 20 can be produced.

[n Electrode Structure of LED Device]

In the present exemplary embodiment, as shown in FIG. 8, the plurality of n electrodes 21$cx$ and 21$cy$ with the same size and the p electrode 21$g$ surrounding the respective n electrodes are formed on one surface of the rectangular substrate in the flip-chip type LED device. The plurality of n electrodes 21 form a plurality of rows, and the n electrodes 21 in one row are arranged in line at regular intervals. Specifically, in the LED device of FIG. 8, three n electrodes 21$cx$ form an n electrode row R1 and three n electrodes 21$cy$ form an n electrode row R2.

Specifically, the plurality of n electrodes are arranged such that, among horizontal lines PL perpendicular to the direction in which the n electrode rows R1 and R2 are arranged and parallel with the opposed two sides 21$ux$ and 21$uy$ of the rectangular substrate 21$a$, two horizontal lines PLux and PLuy each crossing any of the n electrodes with the maximum electrode width of the n electrode and closest to the two sides 21$ux$ and 21$uy$ can be defined as two reference horizontal lines, and the n electrodes in the two adjacent electrode rows can be arranged on any horizontal lines between the two reference horizontal lines.

Furthermore, the two adjacent n electrode rows R1 and R2 are arranged such that the total of the electrode widths of the n electrodes on any of the horizontal lines PL between the two reference horizontal lines (namely, the total of the electrode width x of the n electrode 21$cx$ in the n electrode row R1 and the electrode width y of the n electrode 21$cy$ in the n electrode row R2) can be ±30% of half of the total (X+Y) of the maximum electrode widths of the respective electrodes, namely, 35% or more and 65% or less of the total (X+Y) of the maximum electrode widths of the respective electrodes crossing the two reference horizontal lines.

More specifically, the plurality of n electrodes 21 should be arranged such that any one of n electrodes 21$cx$ and 21$cy$ in the adjacent n electrode rows is arranged on any horizontal line PL between the reference horizontal lines and the following conditions are satisfied:

$$0.7 \times (X+Y)/2 \leq (x+y) \leq 1.3 \times (X+Y)/2,$$

$$0 \leq x \leq X \leq Z/2,$$

$$0 \leq y \leq Y \leq Z/2,$$

Wherein x is an electrode width of n electrode 21$cx$ on a horizontal line PL, y is an electrode width of n electrode 21$cy$ on a horizontal line PL, X is a maximum electrode width of n electrode 21$cx$ on a horizontal line PL, Y is a maximum electrode width of n electrode 21$cy$ on a horizontal line PL, and Z is a length of a side of the rectangular substrate 21$a$ perpendicular to the n electrode rows (side parallel to the horizontal line PL). (See FIG. 8.)

The reason why the n electrode should be arranged as above is as follows.

(1) If the n electrode is not on a horizontal line PL, this causes a partial bright area (this is referred to as "bright unevenness").

(2) If a plurality of n electrodes are arranged on a single horizontal line PL, if the overlapping width with the horizontal line PL is large, and if the overlapping width with other horizontal lines PL is small or zero, then the area on that horizontal line PL with the large overlapping width can cause darker area in part (this is referred to as "dark unevenness").

Figure 1:
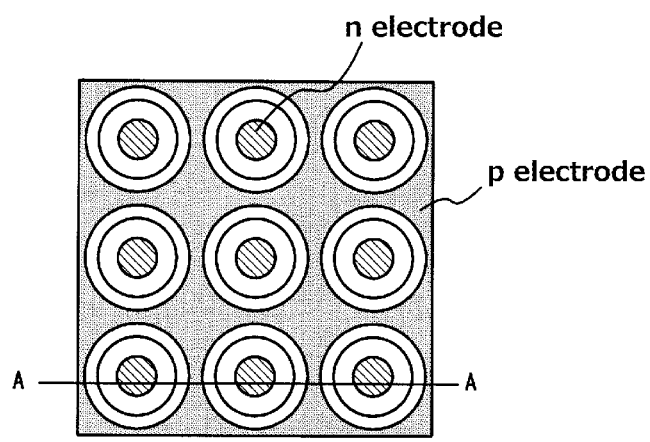
FIG. 1 is a schematic plan view illustrating a conventional flip-chip type LED device when viewed from a rear side of the light emission surface.
Figure 2:
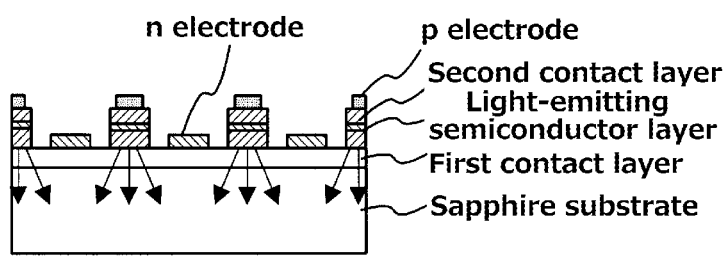
FIG. 2 is a schematic cross-sectional view showing the flip-chip type LED device taken along line A-A in FIG. 1.
Figure 9:
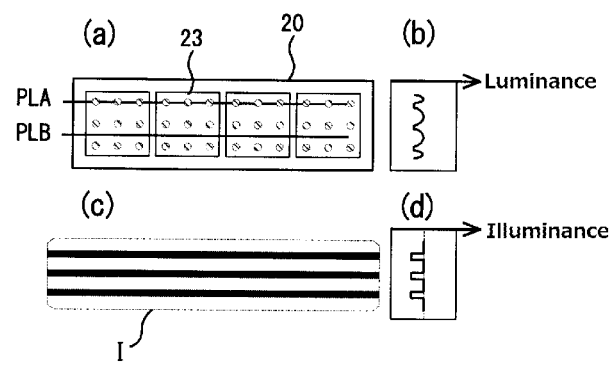
FIG. 9 includes a front view (a) of a conventional LED device module, a diagram (b) showing a luminance distribution when the same LED device module of (a) is turned on, a diagram (c) illustrating a reversed projection image of the same LED device module, and a diagram (d) showing an illuminance distribution of the reversed projection image of the same LED device module.

The bright unevenness and dark unevenness can cause horizontal fringe phenomenon due to the presence/absence of the light-emitting layer above the n electrodes and the p electrodes (due to the darkening on the n electrode). In reality, as shown in FIG. 2, if a plurality of conventional flip-chip type LED devices are arranged in line to form an LED module for a headlamp, when the module is turned on to form a light distribution pattern, three dark horizontal fringes can be formed corresponding to the n electrodes (cathode electrodes) in the adjacent devices in line. For example, suppose that the LED module 20 is configured to include four conventional rectangular LED devices 23 (see FIG. 1) arranged on a horizontal line as shown in FIG. 9($a$) and used in a direct projection type headlamp 10 (see FIG. 5). In this case, the luminance distribution is formed such that the darkened areas are formed above the n electrodes along the horizontal line in the vertical direction. Namely, periodical luminance distribution is formed on the light-emission surface of the LED devices (cross-section in the vertical direction). With reference to FIG. 9($a$), a plurality of n electrodes are arranged on the horizontal line PLA, but not on the horizontal line PLB. This generates three dark horizontal fringes appear in the inverted projection image I formed by combining the LED devices in the light distribution pattern on the virtual vertical screen as shown in FIG. 9($c$) (or four bright horizontal fringes appear) and as shown in FIG. 9($d$) as the illuminance distribution in the vertical direction.

The vehicle lighting unit of the present exemplary embodiment made in accordance with the principles of the presently disclosed subject matter can include the projector optical system 10 including the projector lens 30 as shown in FIG. 4. The projector optical system 10 can be configured to form a light distribution pattern for a headlamp with a cut-off line on the virtual vertical screen in front of the vehicle body by projecting the light source image of the LED module 20 (including the n electrode rows R1 and R2). The projector optical system 10 can form an inverted projection image I including the image portions IR1 and IR2 corresponding to the n electrode rows R1 and R2 of the LED module 20 (see FIG. 4). Each of the image portions IR1 and IR2 can be observed so as to be extended vertically with respect to the cut-off line (horizontal line).

It should be noted that the number of the electrode rows is not limited to two as shown in FIGS. 7 and 8 and may be three or more.

In the illustrated case, among horizontal lines perpendicular to a direction in which the electrode rows are arranged and parallel with the opposed two sides of the rectangular substrate, two horizontal lines each crossing any of the n electrodes with a maximum electrode width of the n electrode and closest to the two sides can be defined as two reference horizontal lines, and the n electrodes in the two adjacent electrode rows can be arranged on any horizontal lines PL between the two reference horizontal lines. Furthermore, the two adjacent electrode rows can be formed such that the total of the electrode widths of the n electrodes on any of the horizontal lines PL between the two reference horizontal lines (total of the electrode width x of the n electrode 21cx and the electrode width y of the n electrode 21cy) should be 35% or more and 65% or less of the total (X+Y) of the maximum electrode widths of the n electrodes that cross the respective two reference horizontal lines.

It should be noted that one electrode row can includes three electrodes in the illustrated example as shown in FIGS. 7 and 8, but may include one or more electrodes in any number.

Example

The present inventor has studied the cause of the horizontal fringes formed with the conventional LED module for a headlamp and the relationship between the light distribution pattern formed by an optical system and the n electrode structure in an LED device used. Accordingly, the present inventor has found the specific n electrode structure can improve the unevenness of luminance distribution in the LED module and also found the conditions to form a luminance distribution in the formed light distribution pattern with less unevenness, to complete the present exemplary embodiments.

Several headlamps with various LED modules having different n electrode structures were prepared and used to form a light distribution pattern. The resulting illuminance unevenness was visually observed. As a result, the present inventor has found that the n electrodes should be arranged to overlap any horizontal lines PL parallel to one side of the rectangular LED device (be present on any horizontal lines PL), and that the degree of overlapping the n electrodes on the horizontal lines PL can be determined such that the total of the electrode widths of two adjacent electrodes on any of the horizontal lines PL should be ±30% of half of the total (X+Y) of the maximum electrode widths of the respective electrodes, namely, fall within the range of 35% or more and 65% or less of the total (X+Y) of the maximum electrode widths of the respective electrodes. The present inventor has confirmed that the LED module for a headlamp can substantially eliminate the visually perceived illuminance unevenness.

Test samples were prepared while the experiments for the samples were performed to confirm the degree of generation of horizontal fringes in accordance with the overlapping degree of adjacent two n electrodes in the two electrode rows on a horizontal line PL.

Figure 10:
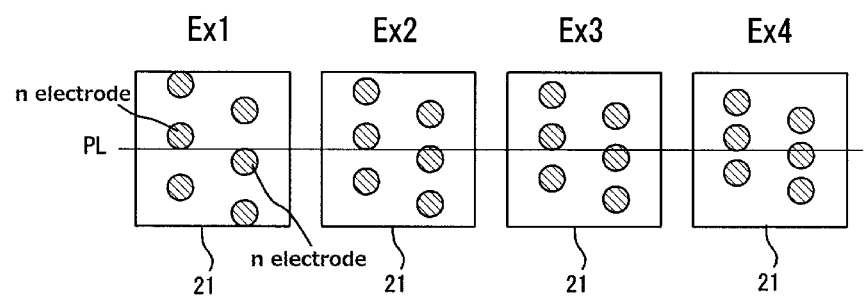
FIG. 10 is a schematic plan view of a light-emitting device when viewed from its light emission surface side, illustrating the comparison of an n-electrode structure of a flip-chip type light-emitting device between a plurality of test examples.

The tested LED device was configured as described above, and included two n electrode rows each including three n electrodes on a square substrate with a side of 480 µm. Each n electrode was circular with a diameter of 80 µm, and the horizontal distance between the center of the n electrode in the first row and the center of the n electrode in the second row was 120 µm. The three n electrodes were arranged in line in a direction perpendicular to the horizontal line PL. Herein, a first test example Ex1 was conducted on the LED device 21 with the n electrode structure wherein the two adjacent n electrodes each touch a common horizontal line PL as shown in FIG. 10. Second to fourth test examples Ex2, Ex3 and Ex 4 were conducted on the LED devices 21 with the n electrode structures wherein the two adjacent n electrodes overlap with the common horizontal line PL with respective increasing widths on the n electrodes as shown in FIG. 10.

With reference to FIG. 11A to 14B, the first to fourth test examples Ex1 to Ex 4 will be described as to the overlapping degree of the two n electrodes of the adjacent n electrode rows when viewed along the horizontal line PL (from its side).

Figure 11A:
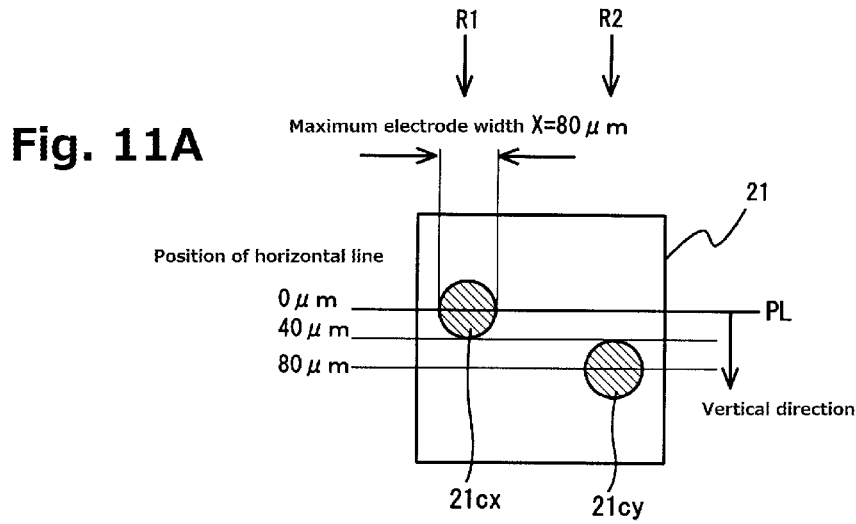
FIG. 11A is a schematic partial plan view of the flip-chip type light-emitting device illustrating a first test example of n electrodes when viewed from its light emission surface side and FIG. 11B is a graph showing the change in the total value of the electrode widths of two n electrodes positioned at the horizontal line of a substrate.
Figure 11B:
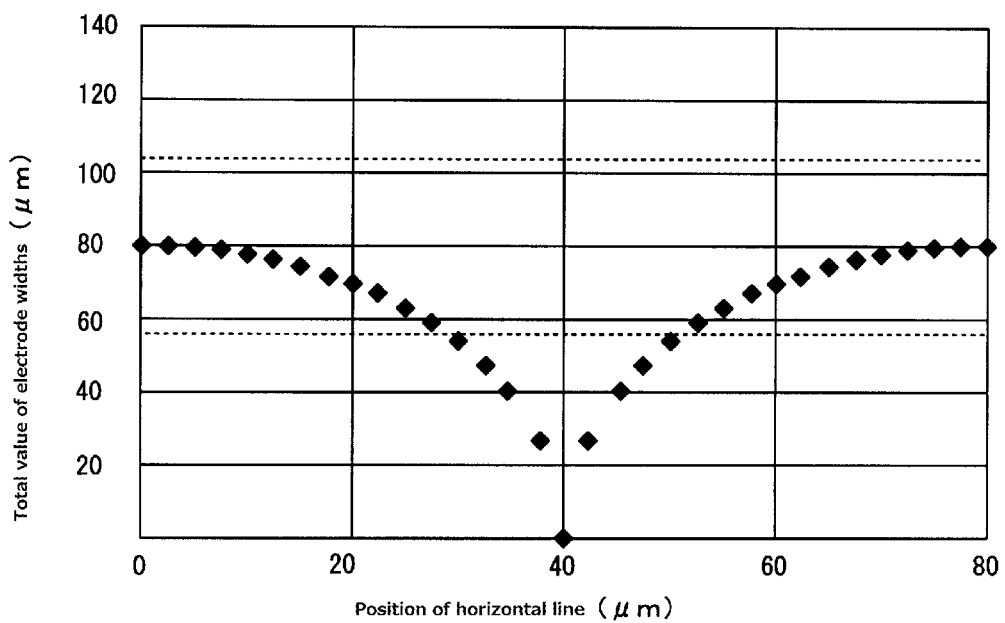

FIG. 11A shows the first test example Ex1. In the LED device 21 of the first test example Ex1, the n electrodes 21cx and 21cy are configured such that, when the position of a first horizontal line PL passing through the center of the left n electrode 21cx is assumed to be 0 µm in the vertical direction, another horizontal line contacts both the left and right n electrodes 21cx and 21cy from its lower and upper sides, respectively, at the position of the diameter 40 µm of the left n electrode 21cx away from the first horizontal line PL. Accordingly, the center positions of the two n electrodes 21cx and 21cy are separated (shifted) from each other by 80 µm in the vertical direction perpendicular to the horizontal line. From the basic positions, the total value (total electrode width) of the electrode widths of the two n electrodes on the same horizontal line (lengths of the horizontal line crossing the n electrodes) is changed by parallel shifting the horizontal line PL by an increment of 2.5 µm from the horizontal line passing through the center of the left n electrode 21cx (at the position of 0 µm) to the horizontal line passing through the center of the right n electrode 21cy (at the position of 80 µm), and the values are plotted. As shown in FIG. 11B, when the horizontal line is placed at the position of 40 µm, the total value of the electrode widths of the two n electrodes 21cx and 21cy crossing the horizontal line is the minimum value of 0 µm.

In the first test example Ex1, the total value of the electrode widths on the horizontal line is varied in the range of 0 µm to 80 µm (0% to 50% of the total maximum width of the respective electrode widths (160 µm)).

Figure 12A:
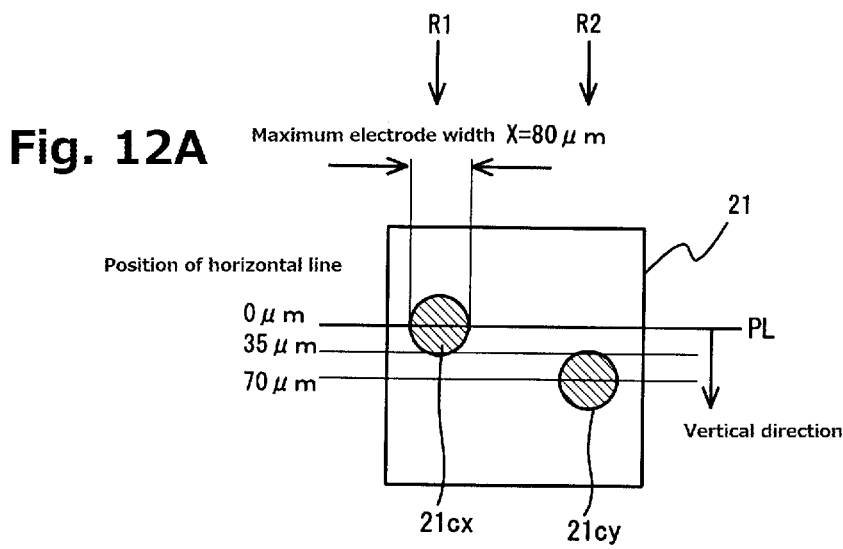
FIG. 12A is a schematic partial plan view of the flip-chip type light-emitting device illustrating a second test example of n electrodes when viewed from its light emission surface side and FIG. 12B is a graph showing the change in the total value of the electrode widths of two n electrodes positioned at the horizontal line of a substrate.
Figure 12B:
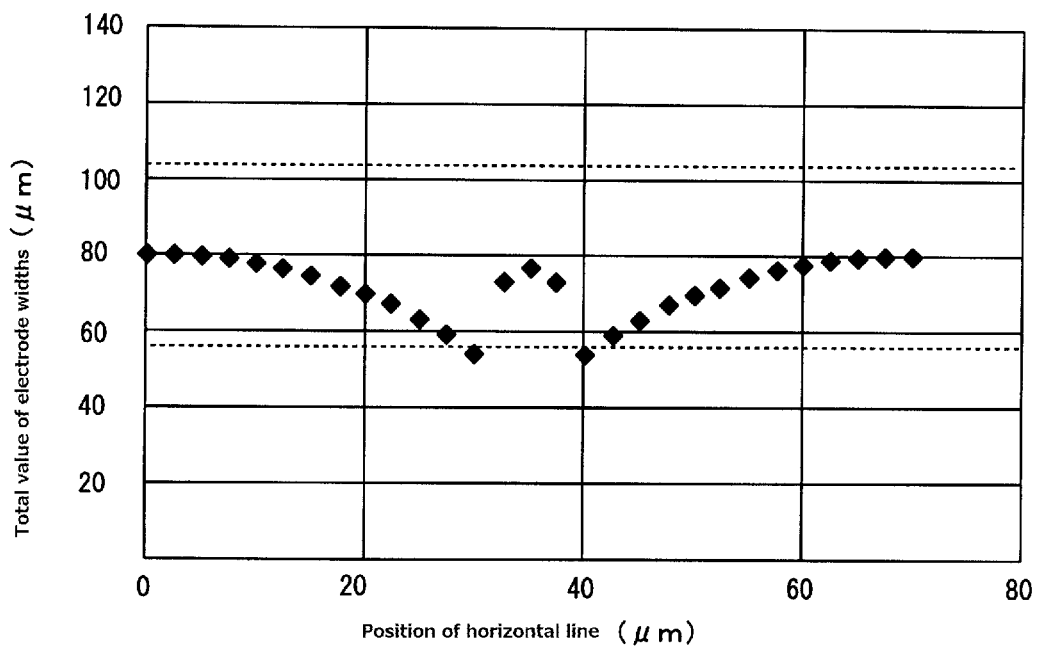

As shown in FIG. 12A, in the LED device 21 of the second test example Ex2, with respect to the horizontal line passing through the center of the left n electrode 21cx at the position of 0 µm, the center of the right n electrode 21cy is shifted by 70 µm in the vertical direction perpendicular to the horizontal line. From the basic positions, the total value of the electrode widths of the two n electrodes is changed by parallel shifting the horizontal line PL by an increment of 2.5 µm from the horizontal line passing through the center of the left n electrode 21cx (at the position of 0 µm) to the horizontal line passing through the center of the right n electrode 21cy (at the position of 70 µm), and the values are plotted. As shown in FIG. 12B, when the horizontal line is placed at the position of 35 μm, the total value of the electrode widths takes the maximum value.

In the second test example Ex2, the total value of the electrode widths on the horizontal line is varied in the range of 52.92 μm to 80 μm (about 33% to 50% of the total maximum width of the respective electrode widths (160 μm)).

Figure 13A:
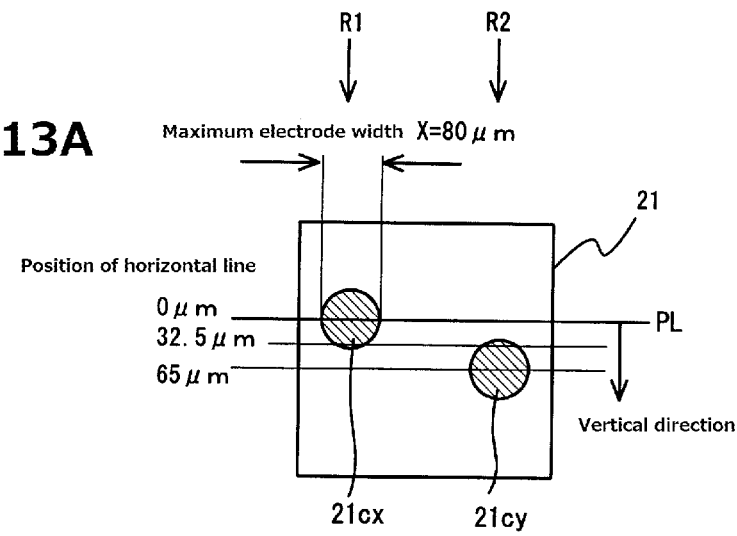
FIG. 13A is a schematic partial plan view of the flip-chip type light-emitting device illustrating a third test example of n electrodes when viewed from its light emission surface side and FIG. 13B is a graph showing the change in the total value of the electrode widths of two n electrodes positioned at the horizontal line of a substrate.
Figure 13B:
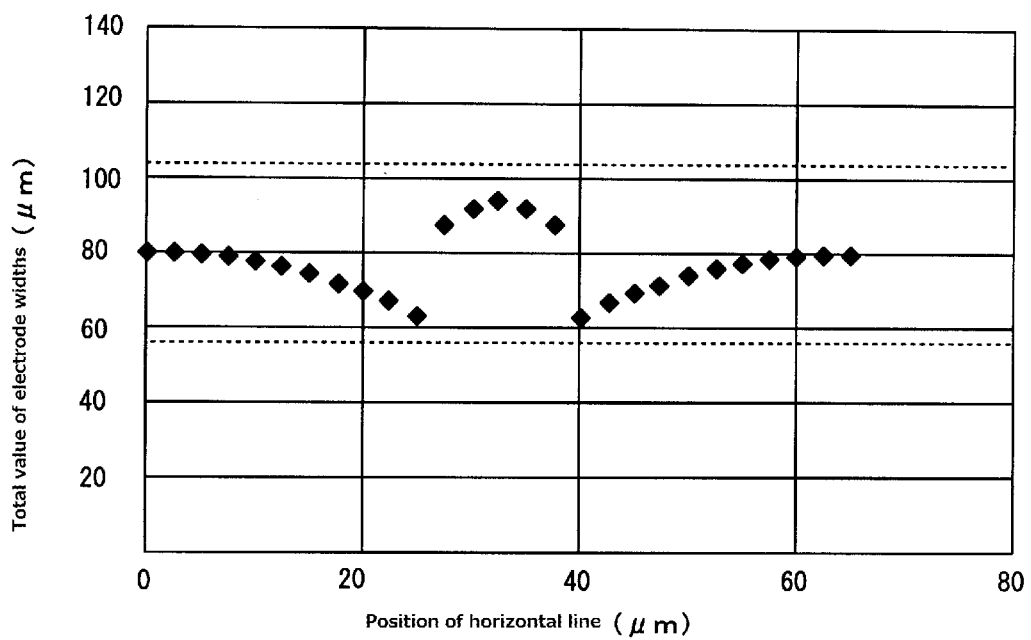

As shown in FIG. 13A, in the LED device 21 of the third test example Ex3, with respect to the horizontal line passing through the center of the left n electrode 21cx at the position of 0 μm, the center of the right n electrode 21cy is shifted by 65 μm in the vertical direction perpendicular to the horizontal line. From the basic positions, the total value of the electrode widths of the two n electrodes is changed by parallel shifting the horizontal line PL by an increment of 2.5 μm from the horizontal line passing through the center of the left n electrode 21cx (at the position of 0 μm) to the horizontal line passing through the center of the right n electrode 21cy (at the position of 65 μm), and the values are plotted. As shown in FIG. 13B, when the horizontal line is placed at the position of 32.5 μm, the total value of the electrode widths takes the maximum value.

In the third test example Ex3, the total value of the electrode widths on the horizontal line is varied in the range of 62.45 μm to 93.28 μm (about 39% to 58% of the total maximum width of the respective electrode widths (160 μm)).

Figure 14A:
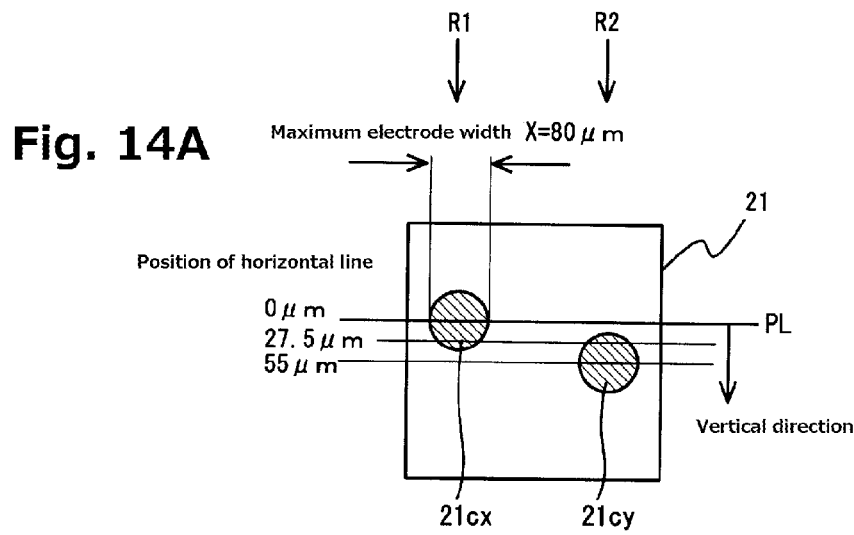
FIG. 14A is a schematic partial plan view of the flip-chip type light-emitting device illustrating a fourth test example of n electrodes when viewed from its light emission surface side and FIG. 14B is a graph showing the change in the total value of the electrode widths of two n electrodes positioned at the horizontal line of a substrate.
Figure 14B:
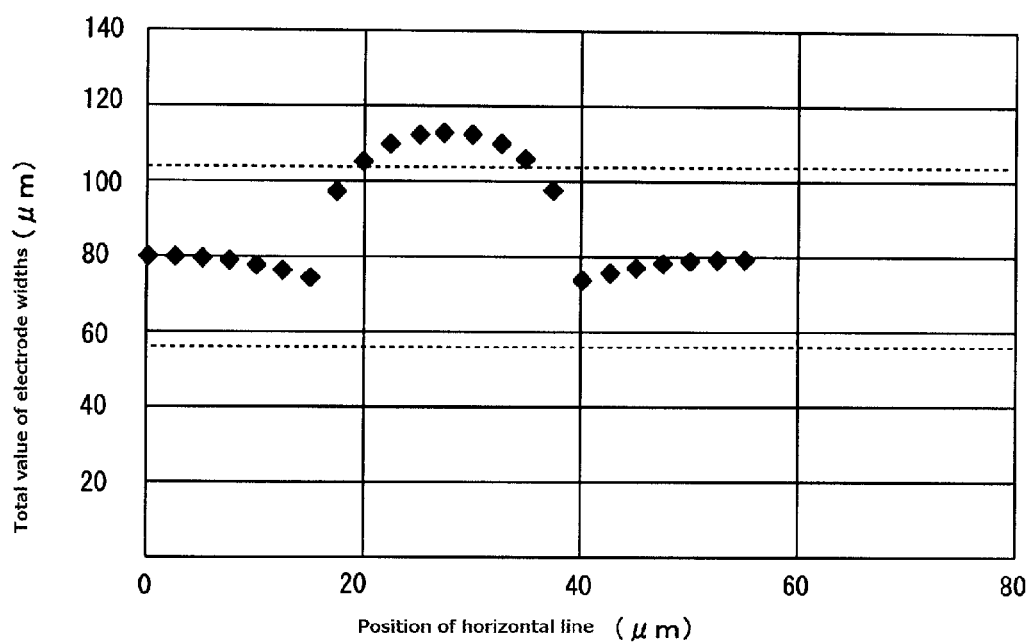

As shown in FIG. 14A, in the LED device 21 of the fourth test example Ex4, with respect to the horizontal line passing through the center of the left n electrode 21cx at the position of 0 μm, the center of the right n electrode 21cy is shifted by 55 μm in the vertical direction perpendicular to the horizontal line. From the basic positions, the total value of the electrode widths of the two n electrodes is changed by parallel shifting the horizontal line PL by an increment of 2.5 μm from the horizontal line passing through the center of the left n electrode 21cx (at the position of 0 μm) to the horizontal line passing through the center of the right n electrode 21cy (at the position of 55 μm), and the values are plotted. As shown in FIG. 14B, when the horizontal line is placed at the position of 27.5 μm, the total value of the electrode widths takes the maximum value.

In the fourth test example Ex4, the total value of the electrode widths on the horizontal line is varied in the range of 74.16 μm to 116.18 μm (about 46% to 73% of the total maximum width of the respective electrode widths (160 μm)).

Next, four LED devices of each the first to fourth test examples Ex1 to Ex4 were arranged in line in the horizontal direction PL to form the LED module as described above. Then, each of the LED modules of the first to fourth test examples Ex1 to Ex4 was formed into a direct projection type headlamp as described above, and the headlamps were turned on to form the respective light distribution patterns by projecting the inverted projection image I of the LED module.

FIG. 15 shows the observation results of the inverted projection images I of the LED modules of the first to fourth test examples Ex1 to Ex4.

In the test example Ex1, slightly bright lines were observed along horizontal lines where the right and left n electrodes 21cx and 21cy were not overlapped, thereby generating horizontal fringes corresponding to the 80 μm shift pitch in the vertical direction.

In the test example Ex2, partial bright unevenness was alleviated at regions corresponding to the horizontal lines where the right and left n electrodes 21cx and 21cy were overlapped, whereby the generation of the horizontal fringes in the light distribution pattern was also alleviated while the horizontal fringes were still visible in the distribution pattern.

In the test example Ex3, the illuminance unevenness in the LED module as well as the horizontal fringes in the light distribution pattern were not visually observed.

In the test example Ex4, slightly dark lines were observed along horizontal lines where the right and left n electrodes 21cx and 21cy were overlapped, thereby generating horizontal fringes corresponding to the 50 μm shift pitch in the vertical direction.

As seen from the test results of the first to fourth test examples, it was confirmed that when the following conditions were met, the dark/bright unevenness visually recognized could substantially be eliminated: the conditions were that the n electrodes are arranged to overlap any horizontal lines PL parallel to one side of the rectangular LED device (be present on any horizontal lines PL), and that the degree of overlapping the n electrodes on the horizontal lines PL is determined such that the total of the electrode widths of two adjacent electrodes on any of the horizontal lines PL should be ±30% of half of the total of the maximum electrode widths of the respective electrodes, namely, 35% or more and 65% or less of the total of the maximum electrode widths of the respective electrodes, and more specifically, in the present test examples, falls within the range of 56 μm to 104 μm (the maximum width of the n electrode is 80 μm). It should be noted that horizontal fringes clearly appeared in the light distribution patterns in the test examples Ex1 and Ex4.

Figure 16A:
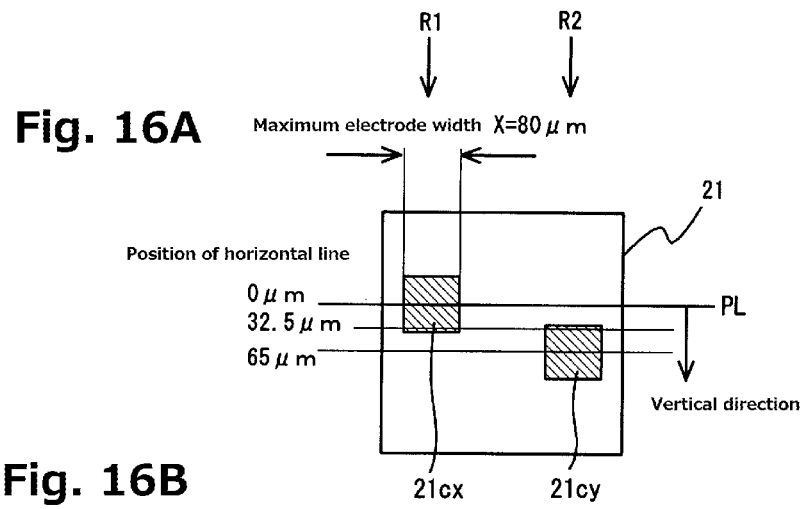
FIG. 16A is a schematic partial plan view of a flip-chip type light-emitting device of a comparative example illustrating n electrodes when viewed from its light emission surface side and FIG. 16B is a graph showing the change in the total value of the electrode widths of two n electrodes positioned at the horizontal line of a substrate.
Figure 16B:
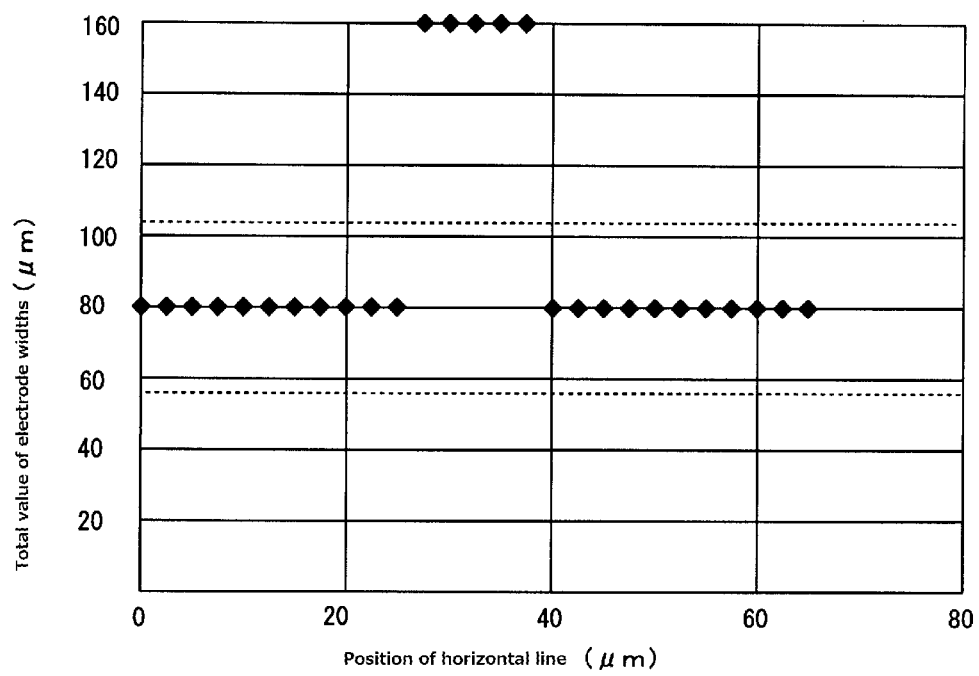

Accordingly, when taking the degree of overlapping the n electrodes on the horizontal lines into consideration, the shape of each of the n electrodes should be designed so that the total of the electrode widths of the n electrodes on any of the horizontal lines PL is 35% or more and 65% or less of the total of the maximum electrode widths of the respective electrodes. As in the comparative example shown in FIG. 16, in the LED device 21 including two square n electrodes (80 μm×80 μm), with respect to the horizontal line passing through the center of the left n electrode 21cx at the position of 0 μm, the center of the right n electrode 21cy is shifted by 65 μm in the vertical direction perpendicular to the horizontal line. From the basic positions, the total value of the electrode widths of the two n electrodes is changed by parallel shifting the horizontal line PL by an increment of 2.5 μm from the horizontal line passing through the center of the left n electrode 21cx (at the position of 0 μm) to the horizontal line passing through the center of the right n electrode 21cy (at the position of 65 μm), and the values are plotted. As is clear from the results, the total value of the electrode widths on the horizontal line PL at the position of 32.5 μm is 160 μm, meaning that the value does not fall within the range of 35% or more and 65% or less because the total value of the maximum electrode widths is 160 μm. In this case, clear horizontal fringes appear in the light distribution pattern as in the test example Ex4. Namely, even if the n electrodes are overlapped with each other on the horizontal line PL, such horizontal fringes cannot be removed without the specific electrode shape and electrode arrangement (that the total of the electrode widths of the electrodes on any of the horizontal lines should fall within the range of 35% or more and 65% or less of the total of the maximum electrode widths).

[Modification 1]

In the above example, a description has been given of the LED device including two electrode rows each having three electrodes. In contrast to this, in the present modification 1, the LED device can include two electrode rows each having one electrode.

Figure 17A:
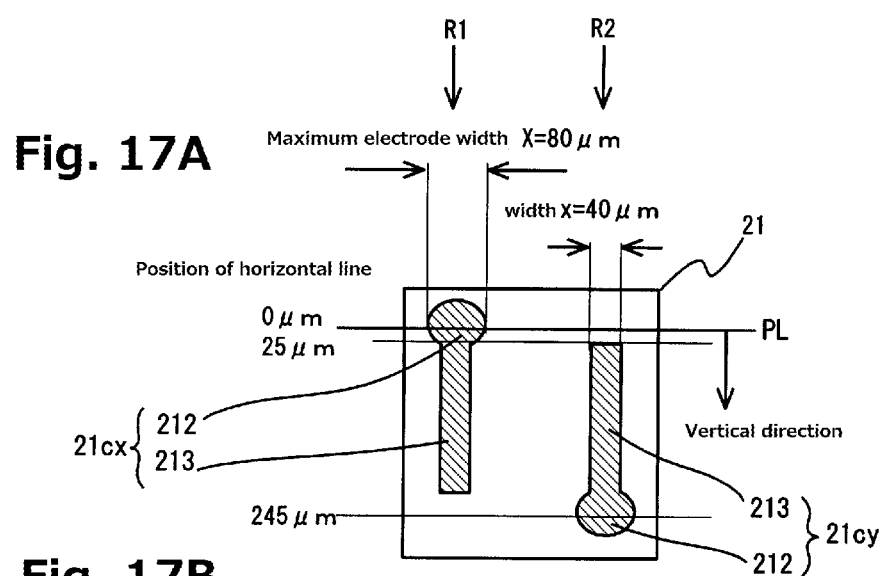
FIG. 17A is a schematic partial plan view of a flip-chip type light-emitting device of a modification of the exemplary embodiment of the presently disclosed subject matter illustrating n electrodes when viewed from its light emission surface side and FIG. 17B is a graph showing the change in the total value of the electrode widths of two n electrodes positioned at the horizontal line of a substrate.

As shown in FIG. 17A, the LED device 21 can include a left n electrode row R1 as an n electrode 21cx and a right electrode row R2 as an n electrode 21cy. Each of the n electrodes 21cx and 21cy can include an electrode main body 212 having the maximum electrode width and an extension portion 213 extending from the electrode main body 212. The extension portion 213 can be a rectangular extension portion with a width of 40 μm and a length of 220 μm from the center of the circular electrode main body 212 (diameter of 80 μm). The rectangular extension portions 213 of the n electrodes 21cx and 21cy can extend in respective opposite directions perpendicular to the horizontal line. The distance between the centers of the electrode main bodies 212 is 245 μm.

Figure 17B:
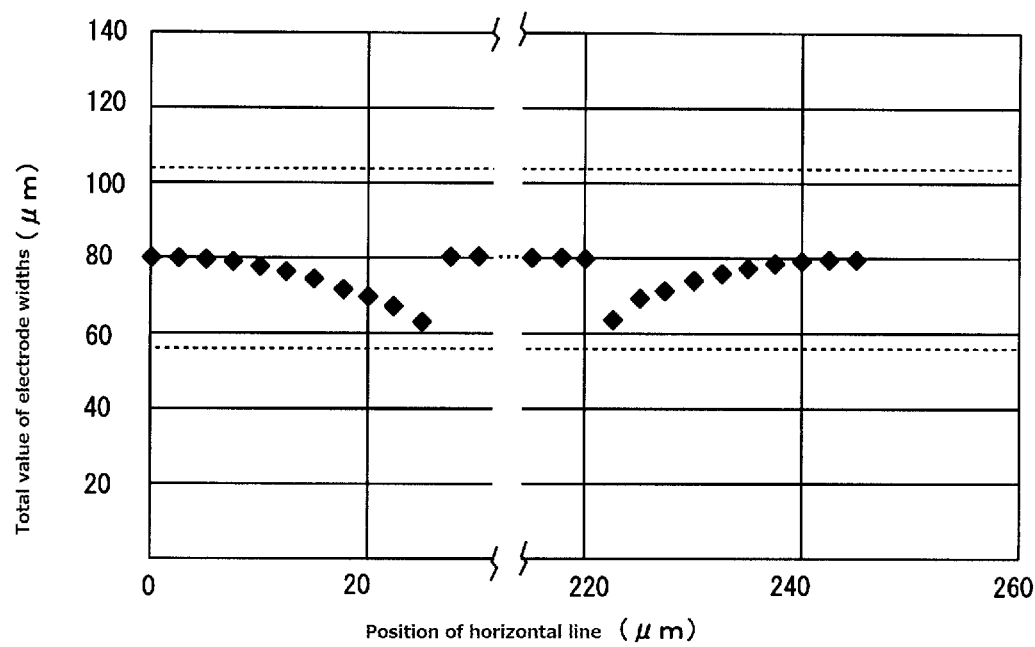

As shown in FIG. 17A, the total value of the electrode widths of the n electrodes is on the same horizontal line (the lengths along which the horizontal line crosses the n electrodes) is changed by parallel shifting the horizontal line PL by an increment of 2.5 μm from the horizontal line passing through the center of the electrode main body of the left n electrode 21cx (at the position of 0 μm) to the horizontal line passing through the center of the electrode main body of the right n electrode 21cy (at the position of 245 μm), and the values are plotted. As shown in FIG. 17B, when the horizontal line is placed at the position in a range of 25 μm to 220 μm, the total value of the electrode widths takes the maximum value.

In the present variation 1, the total value of the electrode widths on the horizontal line is varied in the range of 62.45 μm to 80 μm. As seen from the test results of the present variation 1 shown in FIG. 17B, it was confirmed that when the following conditions were met, the dark/bright unevenness visually recognized could substantially be eliminated in the light distribution pattern: the conditions were that the n electrodes are arranged so that the extension portions 213 of the n electrodes overlap any horizontal lines PL parallel to one side of the rectangular LED device (be present on any horizontal lines PL), and that the degree of overlapping the n electrodes on the horizontal lines PL is determined such that the total of the electrode widths of two adjacent electrodes on any of the horizontal lines PL should satisfy the following formula of $0.7 \times (X+Y)/2 \leq (x+y) \leq 1.3 \times (X+Y)/2$, namely, 35% or more and 65% or less of the total of the maximum electrode widths of the respective electrodes, and more specifically, in the present variation 1, falls within the range of 56 μm to 104 μm (the maximum width of the n electrode is 80 μm).

[Variation 2]

Figure 18A:
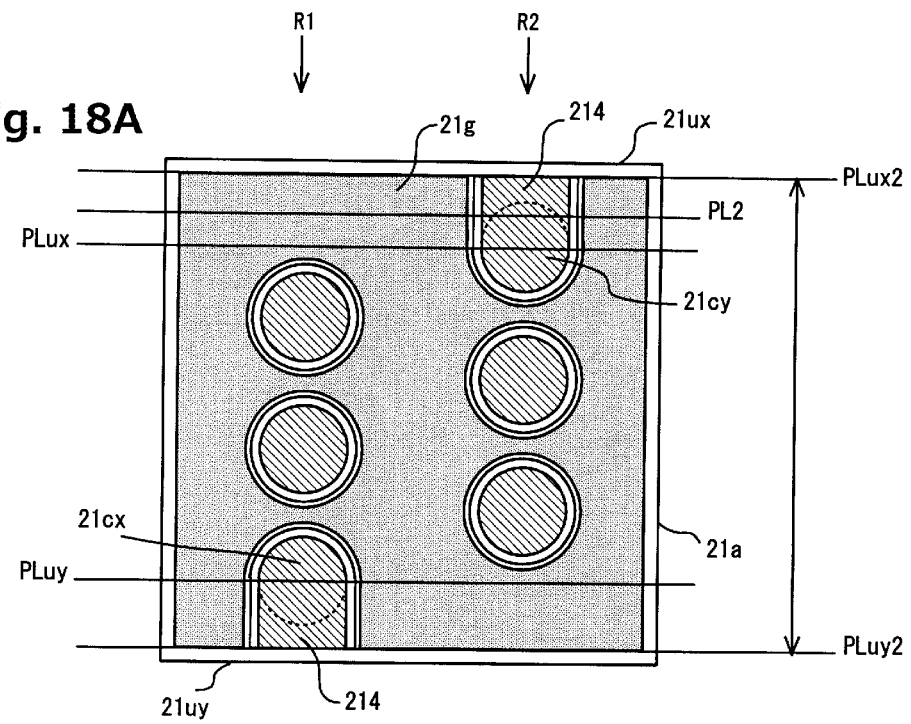
FIGS. 18A and 18B are each a schematic plan view of a flip-chip type light-emitting device of another modification of the exemplary embodiment when viewed from its light emission surface side
Figure 18B:
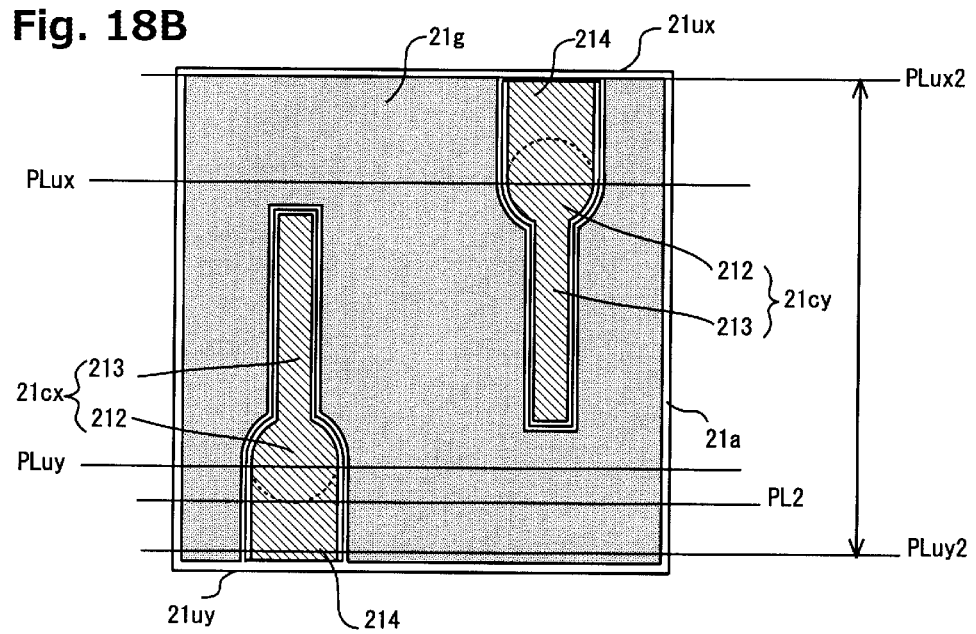

As shown in FIGS. 18A and 18B, the LED device can include n electrode rows further including an enlarged portion 214 provided to the n electrode 21cx, 21cy closest to the sides (21ux, 21uy) of the rectangular transparent substrate 21.

The enlarged portion 214 can have the width equal to the maximum width of the n electrode 21cx, 21cy and extend to the edge of the p electrode 21g (the second reference horizontal lines PLux2 and PLuy2). Namely, the enlarged portion 214 can expand the area of the reference horizontal lines from the reference horizontal lines PLux and PLuy to the second reference horizontal lines PLux2 and PLuy2. Even with the range between the second reference horizontal lines PLux2 and PLuy2, the degree of overlapping the n electrodes on any of the horizontal lines PL2 is determined such that the total of the electrode widths of two adjacent electrodes on any of the horizontal lines PL2 should satisfy the following formula of $0.7 \times (X+Y)/2 \leq (x+y) \leq 1.3 \times (X+Y)/2$, namely, 35% or more and 65% or less of the total of the maximum electrode widths of the respective electrodes. Accordingly, in the variation 2, it was also confirmed that the dark/bright unevenness visually recognized could substantially be eliminated in the light distribution pattern. Note that the LED device shown in FIG. 18A is the same device as shown in FIG. 8 except that the enlarged portions 214 are provided to the left and right n electrodes 21cx and 21cy, respectively, toward the respective sides of the rectangular transparent substrate 21a. Note that the LED device shown in FIG. 18B is the same device as shown in FIG. 17A except that the enlarged portions 214 are provided to the left and right n electrodes 21cx and 21cy, respectively, toward the respective sides of the rectangular transparent substrate 21a.

Further, since the LED devices shown in FIGS. 18A and 18B can lower the luminance around the peripheral portions in the projection image of the LED module, the dark/bright horizontal fringes are prevented from appearing in the light distribution pattern relating to the peripheral portions.

In the above description, the LED device can be a blue LED device and the wavelength conversion layer can contain a phosphor excited by the blue light and emitting yellowish orange light to emit white light (pseudo white light) by the color mixing of blue and yellowish orange. However, any color can be employed as the light color. Accordingly, any combinations of the LED device and the wavelength conversion material can be designed as appropriate. The presently disclosed subject matter can be applied to a general illumination device other than a vehicle headlight.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A vehicle lighting unit including an optical axis, comprising:
    a light-emitting device module;
    a base portion to which the light-emitting device module is secured so as to allow a longitudinal direction of the light-emitting device module to be horizontal when viewed from front while the light-emitting device module faces frontward; and
    a projection lens disposed on the optical axis extending forward from the light-emitting device module on the base portion, for projecting light emitted from the light-emitting device module forward, wherein
    the light emitting device module including a plurality of flip-chip type light-emitting devices, each of the flip-chip type light-emitting devices having a first side; the first sides of the plurality of flip-chip type light-emitting devices being aligned on one line in the longitudinal direction,
    at least one of the flip-chip type light-emitting devices having a rectangular light-transmitting substrate, and a first electrode and a second electrode opposed to the light-transmitting substrate, the at least one flip-chip type light-emitting device being mounted such that two opposed sides of the rectangular light-transmitting substrate are directed in a horizontal direction with respect to the longitudinal direction, the at least one flip-chip type light-emitting device comprising:
the rectangular light-transmitting substrate;
an underlayer semiconductor layer formed on the rectangular light-transmitting substrate;
a plurality of the first electrodes formed on the underlayer semiconductor layer in an island shape;
a light-emitting semiconductor layer including a light-emitting layer formed on the underlayer semiconductor layer, the light-emitting semiconductor layer configured to surround and separate respective first electrodes; and
the second electrode formed on the light-emitting semiconductor layer and configured to surround each of the first electrodes, wherein
the first electrodes are arranged to form a plurality of electrode rows parallel with one side of the rectangular light-transmitting substrate perpendicular to the longitudinal direction,
when, among horizontal lines parallel with the longitudinal direction, two horizontal lines each crossing any of the first electrodes with a maximum electrode width of the first electrode and closest to the two sides are defined as an upper-side reference horizontal line and a lower-side reference horizontal line,
the plurality of electrode rows includes:
a first electrode row comprising some of the first electrodes including the first electrode crossing the lower-side reference horizontal line with the maximum electrode width, and
a second electrode row comprising the remaining part of the first electrodes other than those contained in the first electrode row, including the first electrode crossing the upper-side reference horizontal line with the maximum electrode width,
a total of electrode widths of the first electrodes of the first electrode row and the first electrodes of the second electrode row satisfies following conditions on any of horizontal lines between the upper-side reference horizontal line and the lower-side reference horizontal line, $0.7 \times (X+Y)/2 \leq (x+y) \leq 1.3 \times (X+Y)/2$, $0 \leq x \leq X \leq Z/2$, and $0 \leq y \leq Y \leq Z/2$, wherein x is an electrode width of the first electrode on the horizontal line in the first electrode row,
y is an electrode width of the first electrode on the horizontal line in the second electrode row,
X is the maximum electrode width of the first electrode on the horizontal line in the 1st electrode row,
Y is the maximum electrode width of the first electrode on the horizontal line in the second electrode row, and
Z is a length of a side of the rectangular substrate perpendicular to the electrode rows.

2. The vehicle lighting unit according to claim 1, wherein the first electrode has a circular shape.

3. The vehicle lighting unit according to claim 2, wherein the first electrode is an n electrode and the second electrode is a p electrode.

4. The vehicle lighting unit according to claim 1, wherein the first electrode is an n electrode and the second electrode is a p electrode.

5. The vehicle lighting unit according to claim 1, wherein the electrode rows of the first electrodes provided to the respective flip-chip type light-emitting devices are parallel to each other.

6. The vehicle lighting unit according to claim 5, wherein the first electrode has a circular shape.

7. The vehicle lighting unit according to claim 5, wherein the first electrode is an n electrode and the second electrode is a p electrode.

8. The vehicle lighting unit according to claim 7, wherein the first electrodes between the lower-side reference horizontal line and the upper-side reference horizontal line each have a circular shape with a same diameter.

9. The vehicle lighting unit according to claim 1, further comprising
a projection optical system for projecting a light source image of the light-emitting device module forward so as to form a light distribution pattern for a headlamp including a cut-off line on a virtual vertical screen assumed to be disposed in front of a vehicle body, wherein
the projection optical system is configured such that image portions corresponding to the electrode rows are arranged perpendicular to the horizontal line of the cut-off line in the light distribution pattern.

10. A vehicle lighting unit including an optical axis, comprising:
a light-emitting device module;
a base portion to which the light-emitting device module is secured so as to allow a longitudinal direction of the light-emitting device module to be horizontal when viewed from front while the light-emitting device module faces frontward; and
a projection lens disposed on the optical axis extending forward from the light-emitting device module on the base portion, for projecting light emitted from the light-emitting device module forward, wherein
the light emitting device module including a plurality of flip-chip type light-emitting devices, each of the flip-chip type light-emitting devices having a first side; the first sides of the plurality of flip-chip type light-emitting devices being aligned on one line in the longitudinal direction,
at least one of the flip-chip type light-emitting devices having a rectangular light-transmitting substrate, and a first electrode and a second electrode opposed to the light-transmitting substrate, the flip-chip type light-emitting device being mounted such that two opposed sides of the rectangular light-transmitting substrate are directed in a horizontal direction with respect to the longitudinal direction, the at least one flip-chip type light-emitting device comprising:
the rectangular light-transmitting substrate;
an underlayer semiconductor layer formed on the rectangular light-transmitting substrate;
a plurality of the first electrodes formed on the underlayer semiconductor layer in an island shape;
a light-emitting semiconductor layer including a light-emitting layer formed on the underlayer semiconductor layer, the light-emitting semiconductor layer configured to surround and separate respective first electrodes; and
the second electrode formed on the light-emitting semiconductor layer and configured to surround each of the first electrodes, wherein
the first electrodes are arranged to form a plurality of electrode rows parallel with one side of the rectangular light-transmitting substrate perpendicular to the longitudinal direction, when, among horizontal lines parallel with the longitudinal direction, two horizontal lines each crossing any of the first electrodes with a maximum electrode width of the first electrode and closest to the two sides are defined as an upper-side reference horizontal line and a lower-side reference horizontal line, the plurality of electrode rows includes:
- a first electrode row comprising the first electrodes including the first electrode crossing the lower-side reference horizontal line with the maximum electrode width, and
- a second electrode row comprising the remaining first electrodes other than those contained in the 1st electrode row, including the first electrode crossing the upper-side reference horizontal line with the maximum electrode width, when X is the maximum electrode width of the first electrode on the horizontal line in the first electrode row and Y is the maximum electrode width of the first electrode on the horizontal line in the second electrode row, a total of electrode widths of the first electrodes on any of the horizontal lines is 35% or more and 65% or less of (X+Y).

* * * * *